US010458778B2

(12) United States Patent
Glickman et al.

(10) Patent No.: US 10,458,778 B2
(45) Date of Patent: Oct. 29, 2019

(54) INLINE METROLOGY ON AIR FLOTATION FOR PCB APPLICATIONS

(71) Applicant: Flex Ltd., Singapore (SG)

(72) Inventors: Michael James Glickman, Mountain View, CA (US); Brendan Nagle, Pleasanton, CA (US)

(73) Assignee: Multek Technologies Limited, San Jose, CA (US)

( * ) Notice: Subject to any disclaimer, the term of this patent is extended or adjusted under 35 U.S.C. 154(b) by 0 days.

(21) Appl. No.: 15/816,971

(22) Filed: Nov. 17, 2017

(65) Prior Publication Data

US 2018/0135968 A1 May 17, 2018

Related U.S. Application Data

(60) Provisional application No. 62/423,654, filed on Nov. 17, 2016.

(51) Int. Cl.

*H05K 1/02* (2006.01)
*G01B 11/06* (2006.01)
*H05K 3/00* (2006.01)

(52) U.S. Cl.

CPC ...... *G01B 11/0608* (2013.01); *G01B 11/0691* (2013.01); *H05K 1/02* (2013.01); *H05K 3/00* (2013.01)

(58) Field of Classification Search

CPC ................................ G01B 11/06; G01B 7/107

See application file for complete search history.

(56) References Cited

U.S. PATENT DOCUMENTS 3,671,726 A * 6/1972 Kerr ........................ G01B 11/06 702/172
4,630,172 A 12/1986 Stenerson
5,087,121 A * 2/1992 Kakuchi ................ G01B 11/22 356/626

(Continued)

FOREIGN PATENT DOCUMENTS

CN 108020164 * 10/2016

OTHER PUBLICATIONS

Non-Final Office Action, dated May 14, 2018, U.S. Appl. No. 14/469,150, filed Aug. 26, 2014, Applicant: Weifeng Liu, 14 pages.

(Continued)

*Primary Examiner* — Maurice C Smith

(74) *Attorney, Agent, or Firm* — Haverstock & Owens LLP

(57) ABSTRACT

A measurement system measures various PCB panel characteristics, such as PCB panel thickness, surface feature thickness (height), surface feature width and length, and warpage. Various techniques are also described for steadying the PCB panel for measurement, whether the PCB panel is positioned horizontally or vertically. Z-height measurements as well as light intensity measurements can be used to determine the various PCB panel characteristics. Either the determined light intensity values, the determined Z-height values, or both can be used to determine pixel transition from one region, or material type, to another. Techniques are also provided to reduce PCB panel vibration and/or automatically adjusting a Z-height of the sensor to ensure a sampling point on the PCB panel is within an allowable Z-height range.

18 Claims, 7 Drawing Sheets

12
16
Direction of Motion
20
13

(56) References Cited

U.S. PATENT DOCUMENTS 5,159,750 A 11/1992 Dutta
5,459,639 A 10/1995 Izumi
6,459,493 B1 * 10/2002 Sugiura .................. G01B 11/06 356/630
6,541,712 B1 4/2003 Gately et al.
8,222,537 B2 7/2012 Dudnikov, Jr.
8,302,301 B2 11/2012 Lau
8,519,270 B2 8/2013 Chang
9,549,468 B1 1/2017 Tsai et al.
2001/0010303 A1 8/2001 Caron
2003/0007161 A1 * 1/2003 Bowles .................. G01B 11/06 356/630
2003/0020905 A1 * 1/2003 Savareigo ........ G01N 21/95684 356/237.5
2003/0170553 A1 9/2003 Eberlein
2004/0130730 A1 * 7/2004 Cantin ................... G01B 11/25 356/604
2004/0227953 A1 * 11/2004 Mathur ............. G01B 11/0608 356/496
2006/0017936 A1 * 1/2006 Cantin .............. G01B 11/0608 356/604
2006/0132427 A1 6/2006 Weisberg
2006/0181715 A1 * 8/2006 Bristow ................. G01B 11/06 356/630
2006/0254811 A1 11/2006 Kirstein
2008/0217708 A1 9/2008 Reisner
2008/0253612 A1 10/2008 Reyier
2011/0135248 A1 6/2011 Langer
2012/0024575 A1 2/2012 Zhang
2012/0234587 A1 9/2012 Nakamura
2012/0305775 A1 * 12/2012 Krolak .................. G02B 5/021 250/353
2013/0111996 A1 * 5/2013 Miller .................... G01B 11/06 73/632
2014/0092379 A1 * 4/2014 Niiranen ................ G01B 11/06 356/73
2014/0185060 A1 * 7/2014 Doerband ............. G01N 21/94 356/630
2014/0192346 A1 * 7/2014 Vandervalk ............ G01B 11/06 356/72
2014/0355006 A1 * 12/2014 Hotta ..................... G01N 21/47 356/614
2014/0355009 A1 * 12/2014 Lin ....................... G01B 11/06 356/630
2016/0013152 A1 1/2016 Yu et al.
2016/0021762 A1 1/2016 Kallman
2016/0093540 A1 * 3/2016 Liu ......................... H01L 22/12 438/15
2017/0131701 A1 * 5/2017 Nelson ................ G05B 19/402

OTHER PUBLICATIONS

Non-Final Office Action, dated Oct. 21, 2018, U.S. Appl. No. 14/536,370, filed Nov. 7, 2014, Applicant: Josef Kaiser, 22 pages.

Ayob et al., A Survey of Surface Mount Device Placement Machine Optimisation: Machine Classification , Sep. 2005, Computer Science Technical Report No. NOTTCS-TR-2005-8, 1-35 (Year: 2005), 35 pages.

* cited by examiner

INLINE METROLOGY ON AIR FLOTATION FOR PCB APPLICATIONS

RELATED APPLICATIONS

This patent application claims priority under 35 U.S.C. 119(e) of the U.S. provisional patent application, Application No. 62/423,654, filed on Nov. 17, 2016, and entitled "Inline Metrology on Air Flotation for PCB Applications", which is hereby incorporated in its entirety by reference.

FIELD OF THE INVENTION

The present invention is generally directed to inspection and measurement devices. More specifically, the present invention is directed to a device and system for measuring a thickness of a printed circuit board (PCB) panel and surface feature thickness on the PCB panel.

BACKGROUND OF THE INVENTION

Circuit boards and circuit board panels are designed to have certain characteristics, such as specific circuit board thickness and circuit feature dimensions. Typically, circuit board panels must be removed from the fabrication line and placed on a vibration isolation surface for testing. At present, inline testing during circuit board fabrication is lacking and inadequate. Laser and detector devices have been used to measure thicknesses of solder paste applied to the surfaces of circuit boards, but such devices and measurement techniques do not address the measurement of circuit board thicknesses and circuit feature dimensions.

SUMMARY OF THE INVENTION

A measurement system automates a thickness measurement functionality for determining the thickness of a PCB panel, thicknesses of surface features on the PCB surface, and the type of material at a specific point on the PCB panel surface. The measurement system provides means for stabilizing a PCB panel to enable true inline measurements to be taken. The measurement system can include one or more light emitter and detector devices, a movable platform for positioning a PCB panel, a movable platform for moving each light emitter and detector device, and a controller for controlling movement of the platforms and calculating the PCB panel thickness, surface feature thicknesses, and material type. Each light emitter and detector device includes a light emitter for emitting a light beam onto the PCB panel and a sensor for receiving corresponding reflected light. The sensed data is used by the controller to determine the PCB panel thickness, surface feature thicknesses, and surface material type.

In an aspect, a measurement system is disclosed. The measurement system includes a printed circuit board panel, a light emitter and detector device, a movement and alignment apparatus, and a controller. The printed circuit board panel comprises a substrate having a first side and a second side opposing the first side, wherein the first side comprises an insulating layer with an electrically conductive surface feature positioned on the insulating layer. The light emitter and detector device comprises a light source and a sensor. The light emitter and detector device is positioned relative to the printed circuit board panel such that a light beam output from the light source impinges one or more sample points on the first side of the substrate. The sensor is configured to receive a reflected light corresponding to the light beam. The movement and alignment apparatus is coupled to the printed circuit board panel and the light emitter and detector device. The movement and alignment apparatus is configured to provide relative movement between the light emitter and detector device and the printed circuit board panel and to scan the light beam over at least a portion of the first side of the printed circuit board panel. The controller is configured to receive data from the sensor corresponding to the received reflected light and to determine a distance measurement corresponding to each sample point, and to determine a relative thickness of the printed circuit board panel and a height of the surface feature.

In some embodiments, each sample point corresponds to a pixel of the light beam impinging the first side of the printed circuit board panel. In some embodiments, the light emitter and detector device is configured to emit the light beam focused as a point, wherein the light beam point impinges the first side of the printed circuit board panel as a single pixel. In some embodiments, the light emitter and detector device is configured to emit the light beam focused as a line, wherein the light beam line impinges the first side of the printed circuit board panel as a linear series of pixels. In some embodiments, the light emitter and detector device is configured to emit the light beam focused to impinge the first side of the printed circuit board panel as a two dimensional array of pixels. In some embodiments, the sensor is configured to sense pixel data according to each sample point. In some embodiments, light emitter and detector device is configured to determine the distance measurement corresponding for each pixel of the light beam impinging the printed circuit board panel. In some embodiments, the sensor is configured to sense a light intensity value for each pixel, and the light emitter and detector device is configured to determine a light intensity measurement for each pixel. In some embodiments, the controller is configured to receive the light intensity measurement for each pixel, and to determine if the sample point corresponding to each pixel is a point on the first side of the printed circuit board panel that corresponds to the insulating layer or to the surface feature. In some embodiments, the controller is configured to determine if the sample point corresponding to each pixel is a point on the first side of the printed circuit board panel that corresponds to the insulating layer or to the surface feature by comparing the light intensity measurement to light intensity measurements of known material types to determine a material type corresponding to the pixel, and to compare the determined material type corresponding to the pixel to known materials for the insulating layer and the surface feature. In some embodiments, the controller is further configured to determine a transition point along the first side from insulating layer to surface feature and from surface feature to insulating layer by comparing the determined material type for adjacent pixels, and to determine a number of pixels that separate subsequent transition points along a measured line of sample points, wherein the determined number of pixels that separate subsequent transition points corresponds to a surface feature dimension. In some embodiments, the controller is further configured to determine a transition point along the first side from insulating layer to surface feature and from surface feature to insulating layer by comparing the determined distance measurements for adjacent pixels, and to determine verify an accuracy of the determined transition point by comparing the transition points determined using the determined distance measurements and determined using the determined light intensity measurements. In some embodiments, the controller is further configured to determine a transition point along the first side from insulating layer to surface feature and from surface feature to insulating layer by comparing the determined distance measurements for adjacent pixels, and to determine a number of pixels that separate subsequent transition points along a measured line of sample points, wherein the determined number of pixels that separate subsequent transition points corresponds to a surface feature dimension.

In some embodiments, the second side of the printed circuit board panel comprises a second insulating layer, and the light emitter and detector device is a first light emitter and detector device having a first light source and a first sensor, and the measurement system further comprises a second light emitter and detector device having a second light source and a second sensor, wherein the second light emitter and detector device is positioned relative to the printed circuit board panel such that a second light beam output from the second light source impinges one or more sample points on the second side of the substrate, further wherein the second sensor is configured to receive a second reflected light corresponding to the second light beam, further wherein the movement and alignment apparatus is coupled to the second light emitter and detector device, wherein the movement and alignment apparatus is further configured to provide relative movement between the second light emitter and detector device and the printed circuit board panel and to scan the second light beam over at least a portion of the second side of the printed circuit board panel, wherein the controller is further configured to receive data from the second sensor corresponding to the received second reflected light and to determine a distance measurement corresponding to each sample point on the second side, and to determine a relative thickness of the printed circuit board panel. In some embodiments, the movement and alignment apparatus is configured to move and align the first light emitter and detector device independently of the second light emitter and detector device. In some embodiments, the movement and alignment apparatus is configured to coordinate movement and alignment of the first light emitter and detector device and the second light emitter and detector device, such that the first light emitter and detector device and the second light emitter and detector device simultaneously scan aligned sample points on the first side and the second side of the printed circuit board assembly. In some embodiments, the controller is configured to determine a thickness of the printed circuit board panel at a specific sample point aligned on both the first side and the second side when the specific sample point is aligned with insulating layer on both the first light emitter and detector device and the second light emitter and detector device using the determined distance measurement from the first light emitter and detector device at the specific sample point and the determined distance measurement from the second light emitter and detector device at the specific sample point. In some embodiments, the controller is further configured to determine a height of the first surface feature at another specific sample point aligned on both the first side and the second side when the other specific sample point is aligned with the first surface feature on the first light emitter and detector device and with the insulating layer on the second light emitter and detector device using the determined distance measurement from the first light emitter and detector device at the other specific sample point and the determined distance measurement from the second light emitter and detector device at the other specific sample point.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a measurement system. Those of ordinary skill in the art will realize that the following detailed description of the measurement system is illustrative only and is not intended to be in any way limiting. Other embodiments of the measurement system will readily suggest themselves to such skilled persons having the benefit of this disclosure.

Reference will now be made in detail to implementations of the measurement system as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
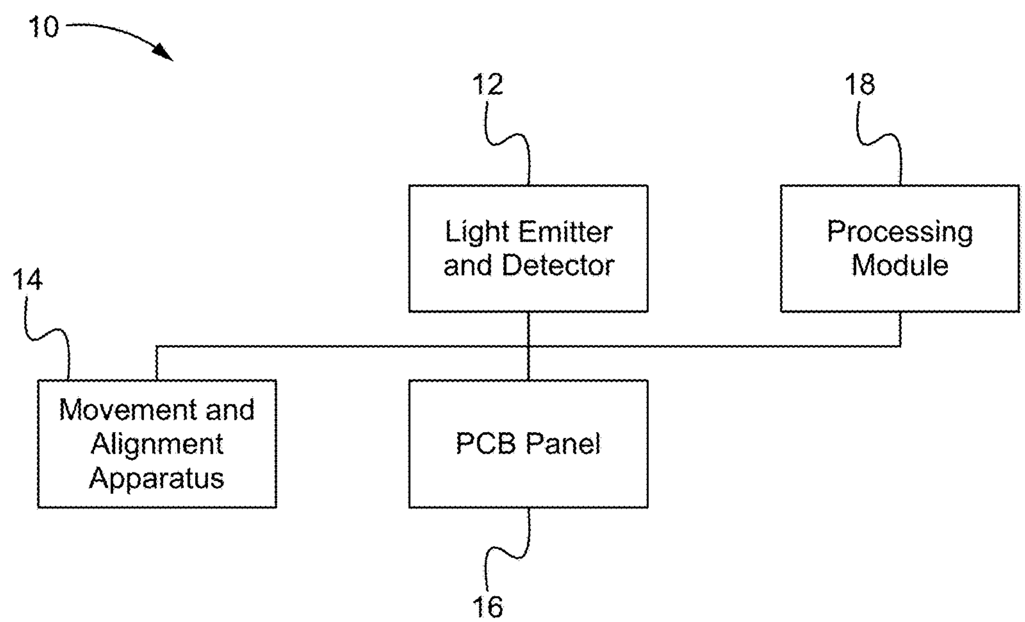
FIG. 1 illustrates a conceptual block diagram of a measurement system according to an embodiment.

FIG. 1 illustrates a conceptual block diagram of a measurement system according to an embodiment. The measurement system 10 includes a light emitter and detector device 12, a movement and alignment apparatus 14, a PCB panel 16 and a processing module 18. The light emitter and detector device 12 includes a light emitter for emitting a light beam onto the PCB panel 16 and a sensor for receiving corresponding reflected light. The sensed data is provided to the processing module 18.

The movement and alignment apparatus 14 can represent one or more movement and alignment devices, each movement and alignment device can be independent of each other or have one or more common components and/or mounting structures. In some embodiments, a first movement and alignment device is configured to properly move and align the light emitter and detector device 12, and a second movement and alignment device is configured to properly move and align the PCB panel 16. In a configuration having two or more light emitter and detector devices, a separate movement and alignment device can be configured for each of the light emitter and detector devices. The first and second movement and alignment devices can be configured to properly align and move relative to each other and/or relative to external alignment markers. The light emitter and detector device 12 and the PCB panel 16 are properly aligned by moving the light emitter and detector device 12 and/or the PCB panel 16. In some embodiments, two separate light emitter and detector devices are used, one light emitter and detector device is positioned on either side of the PCB panel. In this case, another first alignment and movement device is configured to properly align the second light emitter and detector device. In some embodiments, an X-Y-Z gantry is used as the first alignment and movement device.

In some embodiments, the second alignment and movement device includes air bars configured to float the PCB panel on a highly controlled air cushion and an X-Y gantry and/or rollers attached to one or more sides of the PCB panel. A PCB panel is a compilation of multiple PCBs attached together. Eventually, the PCB panel will be cut to form the individual PCBs, but in the PCB panel form the individual PCBs are still connected together. Contact with the surfaces of the PCB panel during fabrication and testing processes is to be avoided so as to prevent damage to the PCBs. However, PCB panels do have a non-functional portion around an outer perimeter edge of the PCB panel, which can be contacted without worry of damaging the PCBs. The second alignment and movement device can include mechanisms, such as the X-Y gantry and/or rollers, which interface with the PCB panel along the non-functional outer perimeter edge. In some embodiments, one or more air bars are used to form the controlled air cushion. The PCB panel is suspended over the air bars by the air cushion to reduce vibration and a first light emitter and detector device is positioned over the top surface of the PCB panel. In the case of two light emitter and detector devices, the second light emitter and detector device is positioned underneath the bottom surface of the PCB panel, and the air bars are sufficiently spaced to enable optical interrogation of at least a portion of the bottom surface by the second light emitter and detector device. In some embodiments, the PCB panel is moveable so as to move the PCB panel in an X-Y plane while the one or more light emitter and detector devices remain stationary. In other embodiments, the one or more light emitter and detector devices are movably mounted so as to move in an X-Y plane and the PCB panel is stationary. In still other embodiments, both the PCB panel is movable and the one or more light emitter and detector devices are movable.

In other embodiments, the second alignment and movement device includes an X-Z gantry attached to one or more sides of the PCB panel, and the PCB panel is suspended vertically. A first light emitter and detector device is positioned to one side of the vertically suspended PCB panel. In the case of two light emitter and detector devices, the second light emitter and detector device is positioned on the opposite side of the vertically suspended PCB panel as the first light emitter and detector device.

The movement and alignment apparatus 14 is configured to properly move and align the light emitter and detector device 12 and the PCB panel 16 so that a thickness measurement can be made at one or more sampling points on the PCB panel 16. In some embodiments, the movement and alignment apparatus 14 is also movably mounted to the light emitter and detector device 12 so as to adjust a Z-height of the light emitter and detector device 12 relative to the PCB panel 6, so as to maintain the sample point on the PCB panel within a tolerated Z-height range. The Z-height of the light emitter and detector device 12 can be maintained by using the sensor data itself. The movement and alignment apparatus 14 and the mount for the light emitter and detector device 12 can be configured to be moved manually or through automated control.

The processing module 18 can include one or more controllers and/or electronic processing circuitry including, but not limited to, microprocessing units (MPUs), central processing units (CPUs) or other integrated circuitry, which can be separate, integrated or some combination, for controlling the movement and alignment apparatus 14 and the light emitter and detector device 12, processing the sensed reflected light data to generate Z-height measurements and light intensity measurements, running one or more algorithms for sampling at multiple points on the PCB panel, and analyzing the measurements to determine various PCB panel and circuit feature characteristics. The processing module 18 can also include user input/output such as a display for displaying raw data, intermediate data and analysis results, as well as a keyboard, mouse or other user interface apparatus as are well know in the art.

In an exemplary application, the PCB panel to be measured has a front side surface and a back side surface. The measurement of the PCB panel is taken at a fabrication stage where the front side and back side surfaces are made of an insulating layer, such as prepreg, with select electrically conductive patterned interconnects. At any given point on the PCB panel, a specific point may be coincident with either insulating layer or a conductive interconnect, such as a metal trace or bond pad. It is an objective of the measurement system to measure a PCB panel thickness and a circuit feature thickness, where a circuit feature is considered to be any type of conductive interconnect. A PCB panel thickness measurement is determined by taking a measurement at a specific point coincident with insulting layer, and a circuit feature thickness is determined by taking a measurement at a specific point coincident with a conductive interconnect.

Figure 2:
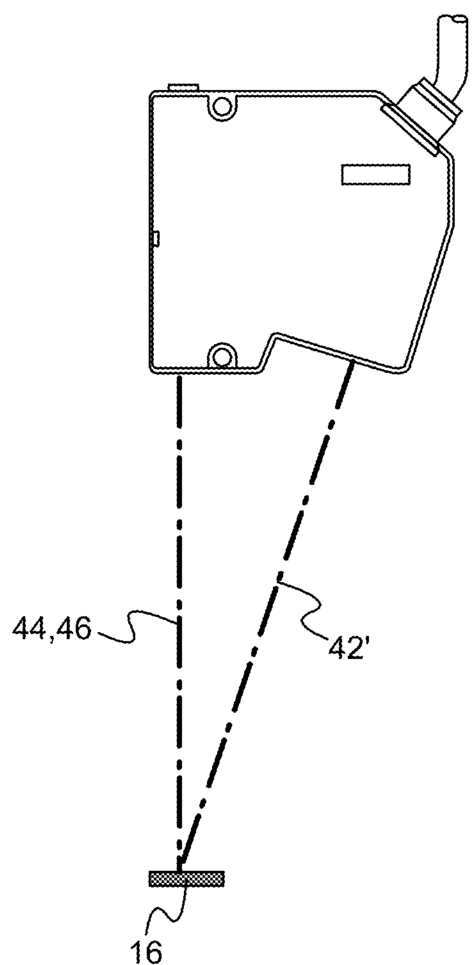
FIG. 2 illustrates a side view of the light emitter and detector device aligned with the PCB panel in a first position for sensing diffuse reflected light.

The light emitter and detector device 12 includes a light source, a sensor and optics for directing the light beam generated by the light source and for directing received reflected light to the sensor. In some embodiments, the light emitter and detector 12 includes processing circuitry and algorithms to determine a Z-height between a sampling point on the PCB panel and a predetermined point on the light emitter and detector device, such as the sensor location, using the sensed reflected light data. In other embodiments, the light emitter and detector device 12 transmits the sensed reflected light data and appropriate device data to the processing module 18, and the processing module 18 is configured with processing circuitry and algorithms to determine a Z-height between a sampling point on the PCB panel and a predetermined point on the light emitter and detector device using the data received from the light emitter and detector device 12. It is understood that any conventional light emitter and detector device, processing circuitry and algorithms can be used to determine the Z-height. For example, one type of light emitter and detector device is configured to sense and process a diffuse reflected light, where the incident light from the light source is projected onto the PCB panel along a vertical axis perpendicular to the PCB panel surface. FIG. 2 illustrates a side view of the light emitter and detector device 12 aligned with the PCB panel 16 in a first position for sensing diffuse reflected light. In this configuration, the light emitter and detector device 12 is positioned such that an incident light 44 is aligned along the vertical axis 46. In the exemplary configuration shown in FIG. 2, the angle of reflection is a function of the light wavelength generated by the light source. It is understood that different reflection angles may be used for different light wavelengths. It is also understood that other types of light emitter and detector devices can be used, the type being determined according to the application.

Figure 3:
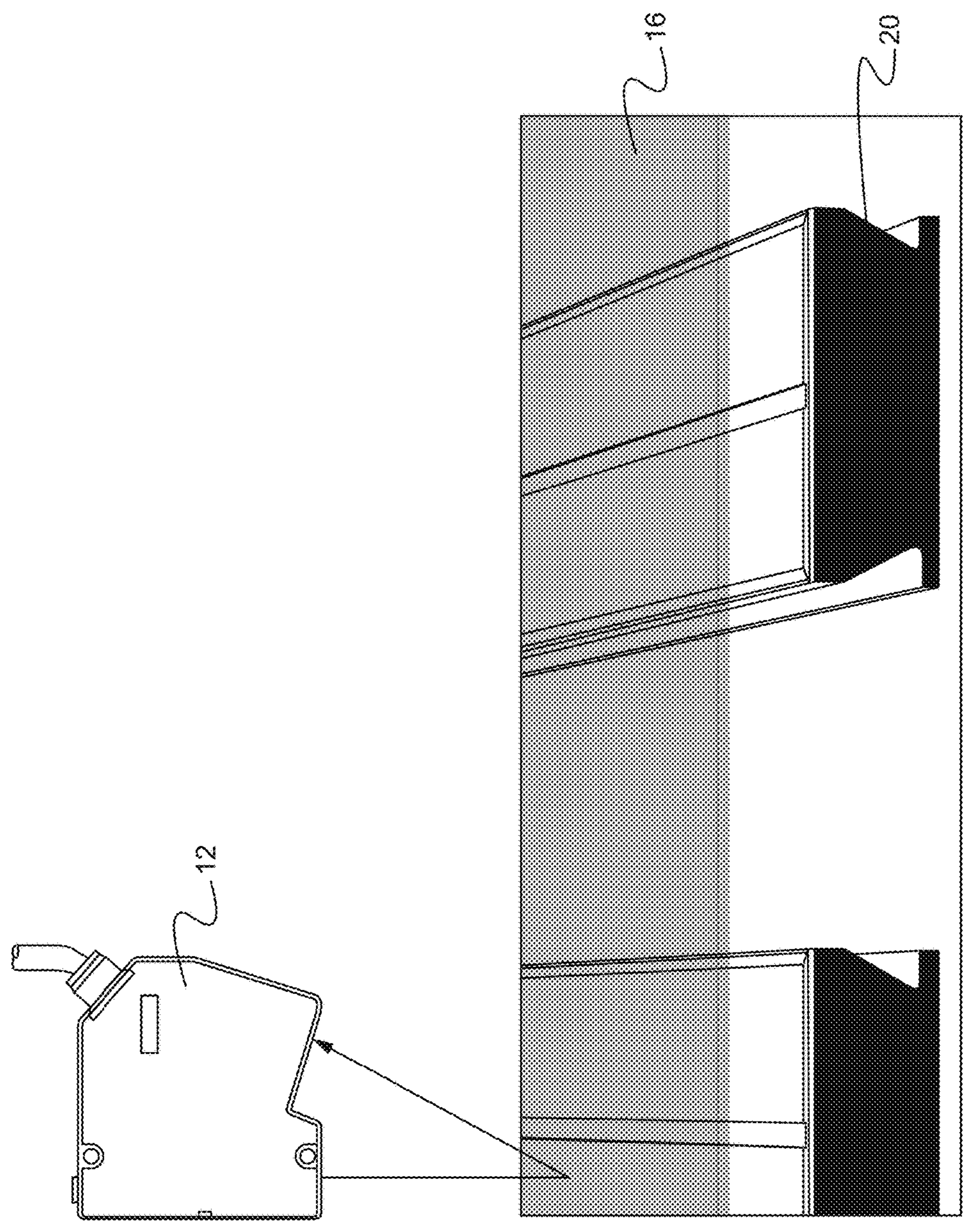
FIG. 3 illustrates a perspective top-down view of the measurement system according to some embodiments.

In some embodiments, the measurement system is configured such that the PCB panel is aligned horizontally and mounted on a plurality of air bars, and a light emitter and detector device is positioned over the PCB panel to measure the front side of the PCB panel. FIG. 3 illustrates a perspective top-down view of the measurement system according to some embodiments. The PCB panel 16 is laid flat in a horizontal position with a front side surface facing upward and a back side surface facing downward. A plurality of air bars 20 are positioned underneath the PCB panel 16. Each air bar 20 ejects pressurized air from its top surface, and an air cushion is formed between the PCB panel 16 and the top surface of each air bar 20. In this manner, the PCB panel 16 is suspended by the air cushions without physically contacting the air bars 20. In the exemplary configuration shown in FIG. 3, there are two air bars 20. It is understood that more than two air bars can be adjacently positioned to support the PCB panel 16. As also shown in FIG. 3, adjacent air bars 20 are separated from each other. It is understood that the air bars can be positioned directly adjacent to each other, in some cases contacting each other. The closer the air bars are positioned to each other, the more substantial and more uniform the overall air cushion that is provided. The larger and more flexible a PCB panel, the more the PCB panel may bow downward in unsupported regions. The number and density of air bars can be selected to reduce PCB panel vibration as well as to mitigate bowing. In some embodiments, each air bar includes a combination of pressurized air and vacuum to precisely position the PCB panel. In general, air bars provide a contactless and precise mounting mechanism. As further shown in FIG. 3, the light emitter and detector device 12 is positioned above the mounted PCB panel 16. The light emitter and detector device 12 is mounted to a corresponding movement and alignment apparatus (not shown) to properly position the light emitter and detector device 12. In some embodiments, the movement and alignment apparatus is further configured to move the light emitter and detector 12 relative to the PCB panel 16. In some embodiments, the PCB panel 16 is coupled to another movement and alignment apparatus (not shown), such as rollers contacting the non-functional outer perimeter edges of the PCB panel 16, to move the PCB panel 16 relative to the air bars 16. The movement and alignment apparatuses can be configured to move the PCB panel 16 and/or the light emitter and detector device 12 such that light emitted from the light emitter and detector device 12 is scanned across an entirety of or a defined portion of the front side surface of the PCB panel 16.

The light emitter and detector device 12 includes a scanning head configurable to emit light in a prescribed structure. In some embodiments, the scanning head emits light that impinges the PCB panel as a single point, such as a pixel. In other embodiments, the scanning head emits light that impinges the PCB panel as a line, such as a series of adjacent pixels. In still other embodiments, the scanning head emits light that impinges the PCB panel as a surface area, such as an N×M array of pixels where $N>2$ and $M\geq 1$.

The thickness of the PCB panel at a given point can be measured for relative accuracy by comparing the Z-height measurement determined for the given point to a Z-height measurement determined at a calibration point, such as a fiducial location, on the PCB panel. If the Z-height measurement at the given point is within tolerance of the Z-height measurement at the calibration point, then the PCB thickness at the given point is considered to be within tolerance, and meets specification. Such a determination can be made when the given point measured corresponds to insulation layer. Where the given point corresponds to a surface feature, the measured Z-height can be subtracted from the Z-height measurement at the calibration point, and if the difference is within tolerance of a defined surface feature height, then the surface feature thickness at the given point is considered to be within tolerance, and meets specifications. It is understood that other methodologies can be used to determine if the PCB panel thickness or surface feature thickness at a given point is within tolerance. For example, instead of comparing the determined Z-height at the given point to the Z-height at a calibration point, the determined Z-height at the given point can be compared to other determined Z-height values at points neighboring the given point, these neighboring points are considered a local area. Z-heights within the local area can be compared, average Z-heights of neighboring local areas can be compared, and/or the Z-height of the given point can be compared to the average Z-height of a neighboring local area, all for the purpose of determining if determined Z-heights are within tolerance.

In the case where the scanning head is configured to emit a line or surface area, the length of the line or the surface area dimensions are also configurable. In most applications, the line length is less than a length or width of the PCB panel, and the surface area is less than a surface area of the PCB panel. If the PCB panel is generally referred to as extending in the X-Y plane (thickness of the PCB panel referenced in the Z-axis), a line of pixels can be scanned (X-direction or Y-direction), or a surface area can be scanned (X by Y area). Scanning as a line or a surface area essentially multiplexes measurements from multiple individual pixels, which increases scanning speed. Such multiplexing also enables a single light emitter and detector device to determine a surface feature location, height, and width. For example, a scanning head is configured to scan a line of 500 pixels and the sensor is able to simultaneously sense data corresponding to all 500 pixels. Along this line some pixels impinge the insulating layer of the PCB panel and some pixels impinge surface features. Those pixels impinging the insulating layer have a greater measured Z-height than those impinging surface features. Each larger value can be used as an insulting layer position, and each smaller value can be used an a surface feature position. Comparison of these larger and smaller values can determine a transition from insulting layer to surface feature and vice-versa. A distance, in pixels, between transition points can determine a dimension of the surface feature. Additionally, the larger values in a local area can be averaged as a relative local PCB panel thickness, and the smaller values can be subtracted from the average relative local PCB panel thickness to determine a surface feature height. Similar functionality and scanning capabilities can be applied to achieve desired surface area dimensions.

To improve throughput and scanning speed, multiple light emitter and detector devices can be used to scan and measure a given surface of the PCB panel. For example, multiple light emitter and detector devices can each be configured to emit light that impinges the PCB panel front side surface as a short line, and the multiple light emitter and detector devices are adjacently positioned in a line such that the corresponding emitted light short lines form a non-overlapping, continuous long line impinging the PCB panel front side surface. In this manner, an impinging light line can extend an entire width or length of the PCB panel, and the entire PCB panel front side surface can be scanned in a single pass. It is understood that a long line that is shorter than the entire width or length of the PCB panel can also be used.

In some embodiments, the light emitter and detector device 12 is configured to measure a light intensity value at each pixel of the impinging light. The measured light intensity can then be used to determine the type of material at the sampled location. For example, the measured light intensity value can be used to determine if the pixel is impinging a sampled position that corresponds to insulating layer material, such as prepreg, or surface feature material, such as copper. The measured light intensity value is compared to known light intensity values for known materials, stored in the processing module 18. Because the surface features may be quite small, this method may be necessary, as opposed to only relying on comparing the x, y coordinates of the light emitter and detector device to a contour map (with x, y mapping) of the PCB panel. In an exemplary implementation, the mechanical precision of the movement and alignment apparatus, such as an x-y-z gantry, may be 1 mm, but the surface feature may be only 25 microns across. Both the Z-height measurements and the light intensity measurements can be cross-referenced to determined if a specific pixel measurement is for a PCB panel thickness measurement or a surface feature measurement. Such cross-referencing also decreases false error readings, for example a measurement for a PCB panel thickness is not confused with one for a surface feature measurement. Use of measured light intensity values also enables another means for measuring surface feature widths and lengths by determining the transition points between materials. This can be used in conjunction with the transition point determinations made using the Z-height measurements described above. Cross-referencing Z-height measurements and light intensity measurements also reduces noise in the measurement values and provides a form of system redundancy.

Figure 4:
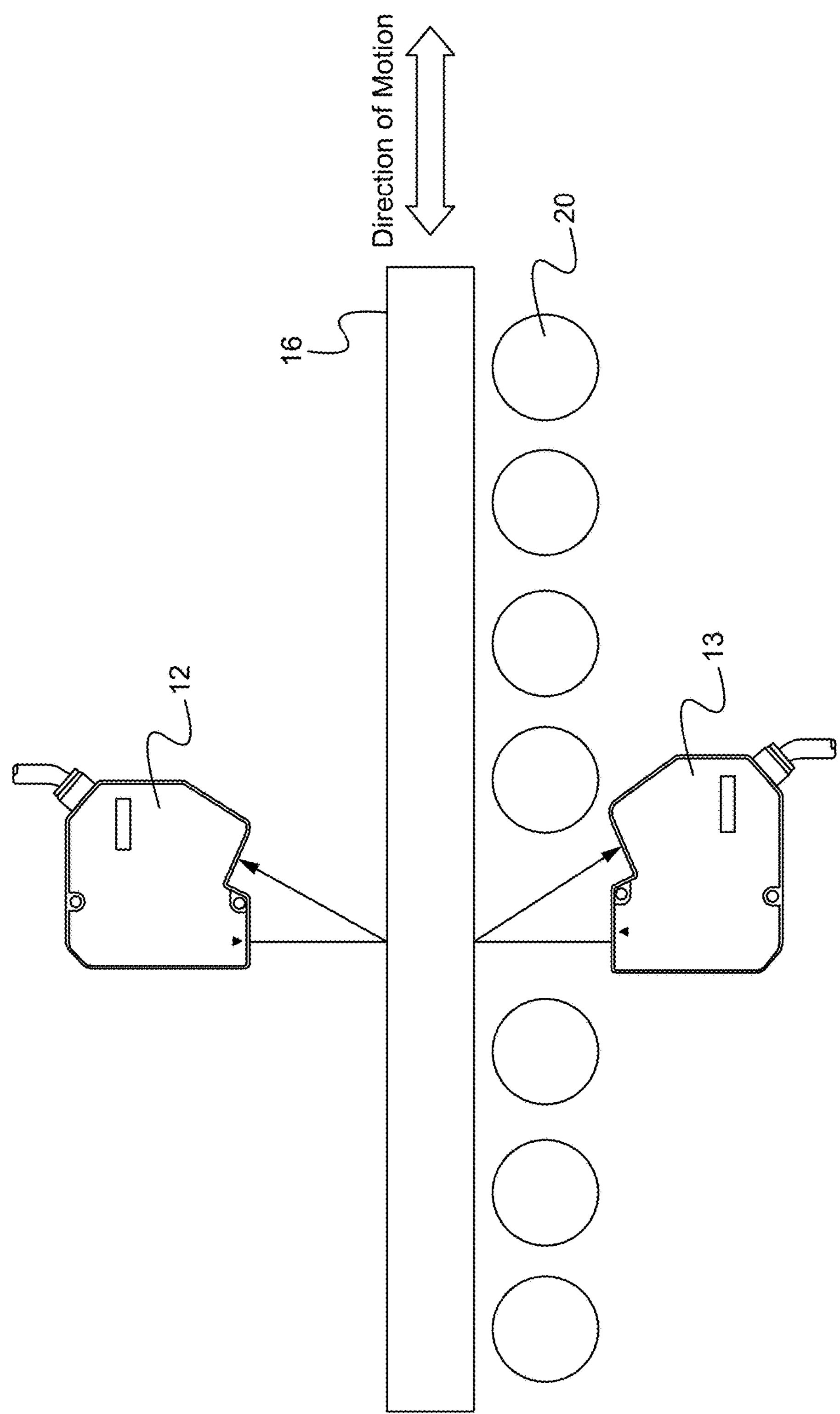
FIG. 4 illustrates a side view of a measurement system according to other embodiments.

In the embodiments described above, one or more light emitter and detector devices are positioned over a single side of the PCB panel, such as light emitter and detector device 12 positioned over the front side surface of PCB panel 16 in FIG. 3. In other embodiments, one or more additional light emitter and detector device can be positioned on the opposite side of the PCB panel. FIG. 4 illustrates a side view of a measurement system according to other embodiments. The measurement system shown in FIG. 4 is similar to the measurement system in FIG. 3 with the addition of another light emitter and detector device 13 positioned underneath the PCB panel 16. The additional light emitter and detector device 13 can function similarly as the light emitter and detector device 12 and can be similarly mounted for movement and alignment. Positioning light emitter and detector devices underneath the PCB panel is more problematic because any underlying structure used to support the PCB panel needs to provide optical access to the back side PCB panel. In the exemplary configuration of FIG. 4, such optical access is provided by the gap between the air bars 20. In this configuration, the PCB panel 16 may need to be moved relative to the air bars 20 to provide optical access to certain locations on the PCB panel back side. In many applications, the entire PCB panel is not scanned due to time constraints, so only a select portion or portions of the PCB panel are scanned, such select portions or portions are made optically accessible by designed gaps between the air bars and if necessary by movement of the PCB panel relative to the air bars.

Figure 5:
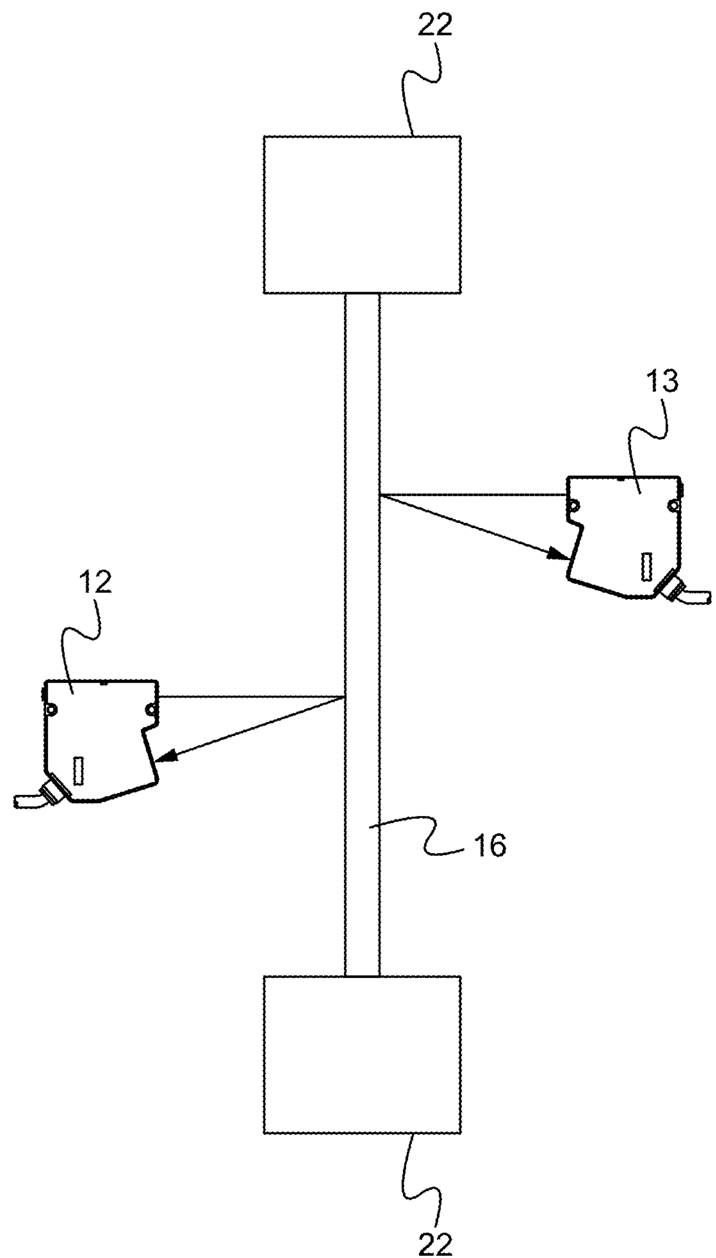
FIG. 5 illustrates a side view of a measurement system according to some embodiments where the PCB panel is vertically positioned.

In the embodiments described above, the measurement system is configured such that the PCB panel is supported in a horizontal position. In other embodiments, the measurement system is configured to support the PCB panel in a vertical position. FIG. 5 illustrates a side view of a measurement system according to some embodiments where the PCB panel is vertically positioned. The PCB panel 16 is suspended vertically by mounting mechanisms 22. An exemplary mounting mechanism is a clamp, but it is understood that any conventional mounting mechanism can be used to vertically suspend the PCB panel 16. In some embodiments, a first mounting mechanism 22 holds an upper edge of the PCB panel 16 and a second mounting mechanism 22 holds a lower edge of the PCB panel 16. In some embodiments, lateral stability can be provided by positioning one or more air bars (not shown) to either side of the PCB panel 16. Light emitter and detector device 12 is positioned to scan and measure the PCB panel front side surface and the light emitter and detector device 13 is positioned to scan and measure the PCB panel back side surface in a manner similar to that described above in relation to the horizontally mounted PCB panel.

Figure 6:
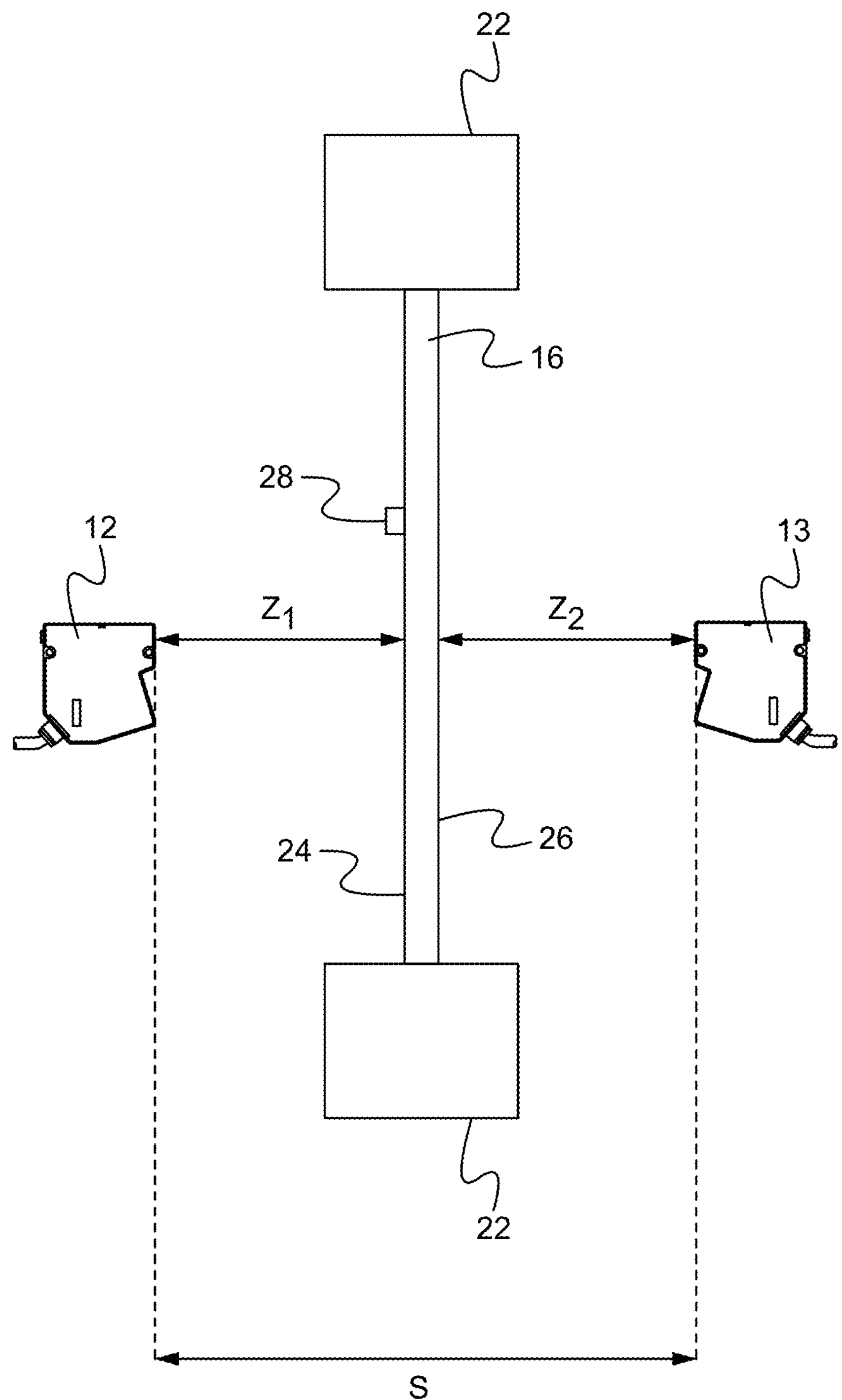
FIGS. 6 and 7 illustrate side views of a measurement system with coordinated light emitter and detector devices according to some embodiments.
Figure 7:
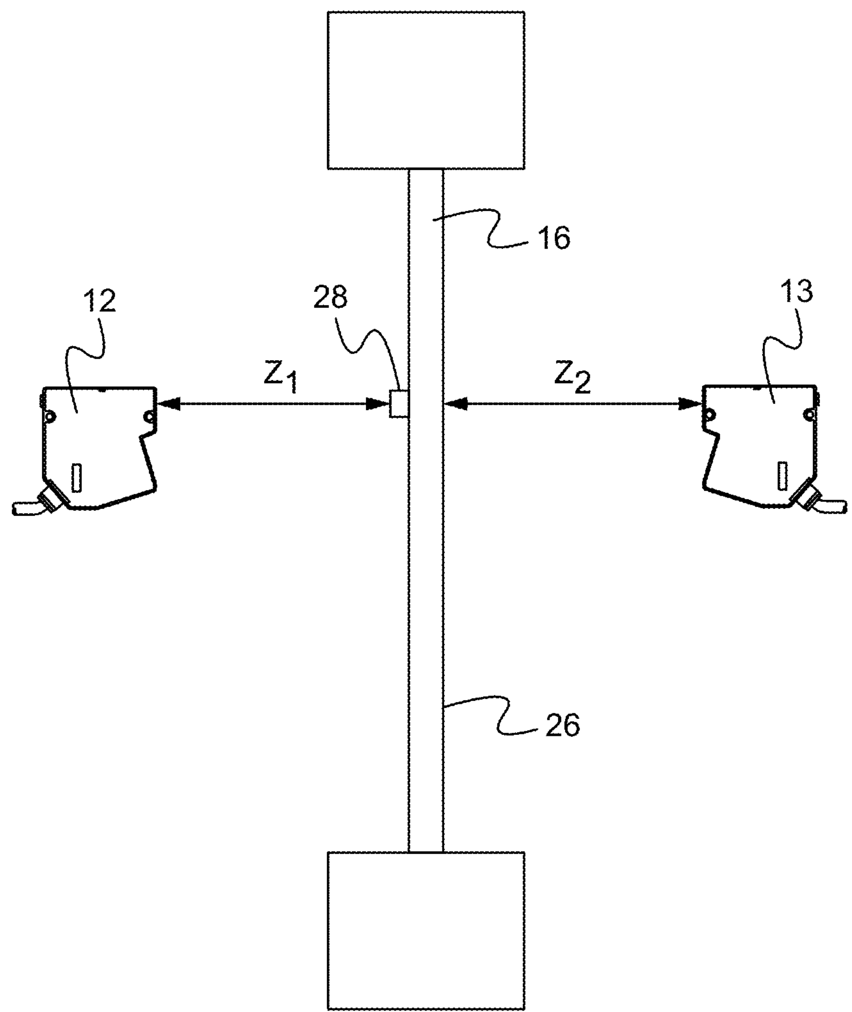

In some embodiments, when light emitter and detector devices are positioned on opposing sides of the PCB panel, the light emitter and detector device on one side of the PCB panel moves and takes measurements independently of the light emitter and detector device on the other side of the PCB panel. In other embodiments, the light emitter and detector devices on both sides of the PCB panel are coordinated. FIGS. 6 and 7 illustrate side views of a measurement system with coordinated light emitter and detector devices according to some embodiments. The measurement system of FIGS. 6 and 7 can move, scan, and take measurements in a manner similar to that described above, and in addition the light emitter and detector device 12 and the light emitter and detector device 13 are aligned and synced to move in tandem to simultaneously scan corresponding areas on opposing sides of the PCB panel 16. As shown in FIG. 6, the two light emitter and detector devices 12, 13 are aligned and positioned over opposing areas on the front side and back side corresponding to insulating layer. Each light emitter and detector device 12, 13 is configured to measure a Z-height. Using two light emitter and detector devices, one on each side of the PCB panel, enables determination of the PCB panel thickness at that area. If both light emitter and detector devices are aligned with an insulating layer of the PCB panel, such as shown in FIG. 6, then thickness of the PCB panel at the given area can be determined. For example, the Z-height measurement Z1 taken by the light emitter and detector device 12 is a distance measurement between the light emitter and detector device 12 and a given point on the insulating layer 24 of the PCB panel front side surface. Similarly, the Z-height measurement Z2 taken by the light emitter and detector device 13 is a distance measurement between the light emitter and detector device 13 and a given point on the insulating layer 26 of the PCB panel back side surface. A separation distance S between the light emitter and detector device 12 and the light emitter and detector device 13 is known. The PCB panel thickness P at the given points can be determined by subtracting the determined Z-height measurement Z1 and the determined Z-height measurement Z2 from the separation distance S ($P=S-Z1-Z2$).

Using two light emitter and detector devices, one on each side of the PCB panel, also enables determination of the surface feature thickness at that area. If both light emitter and detector devices are aligned with a surface feature on the PCB panel, such as surface feature 28 on the PCB panel front side as shown in FIG. 7, then thickness of the surface feature at the given area can be determined. For example, the Z-height measurement Z1 taken by the light emitter and detector device 12 is now a distance measurement between the light emitter and detector device 12 and the surface feature 28. The Z-height measurement Z2 taken by the light emitter and detector device 13 is still the distance measurement between the light emitter and detector device 13 and a given point on the insulating layer 26 of the PCB panel back side surface. The surface feature thickness SF can be determined by subtracting the determined Z-height measurement Z1 and the determined Z-height measurement Z2 from the separation distance S, and by also subtracting out the PCB panel thickness P as determined for the local area, or as determined for a point neighboring the surface feature (SF=S−Z1−Z2−P). Although the PCB panel thickness may vary over the entire PCB panel, the local PCB panel thickness can be presumed to be substantially constant for these measurement purposes. It is understood that alternative calculation methods can be used to determine the PCB panel thickness and the surface feature thickness using the coordinated light emitter and detector devices.

The measurement system can be advantageously used to measure various PCB panel characteristics, such as PCB panel thickness, surface feature thickness (height), and surface feature width and length. In some applications, the measurement system can be used to determine warpage of the PCB panel. Various techniques are also provided for steadying the PCB panel for measurement, whether the PCB panel is positioned horizontally or vertically. Z-height measurements as well as light intensity measurements can be used to determine the various PCB panel characteristics. Either the determined light intensity values, the determined Z-height values, or both can be used to determine pixel transition from one region, or material type, to another. Using both the determined light intensity values and the determined Z-height values can have the added benefit of reducing noise since two separate measurements can be used to determine the same characteristic.

The measurement system is part of a PCB processing line for fabricating PCB panels. In some embodiments, the measurement system is implemented within an un-loader, where the un-loader is a standard piece of equipment used in PCB processing lines. Pre-processed PCB panels arrive stacked on a cart and are placed inside of a loader, which has an arm with suction cups and a conveyor. The loader is physically placed in a front of a first piece of equipment in the PCB processing line, and the conveyors are aligned to allow the PCB panel to bridge the gap between the loader and the first piece of equipment. Each PCB panel goes through the PCB processing line, and then enters an enclosed area, called the un-loader, while still on a conveyor. The measurement system performs the measurements as described. The un-loader also includes an arm with suction cups and once the measurement system completes its function, the un-loader picks up the PCB panel and places it on a second cart. The un-loader is an enclosed area and substantially isolates the PCB panel from fumes present in other areas of the PCB processing line. It is understood that the measurement system can be implemented in stations other than the un-loader, or as a stand-alone station, within the PCB processing line.

The present application has been described in terms of specific embodiments incorporating details to facilitate the understanding of the principles of construction and operation of the measurement system. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A measurement system comprising:

a. a printed circuit board panel comprising a substrate having a first side and a second side opposing the first side, wherein the first side comprises an insulating layer with a surface feature positioned on the insulating layer, wherein the surface feature is a conductive patterned interconnect;

b. a light emitter and detector device comprising a light source and a sensor, wherein the light emitter and detector device is positioned relative to the printed circuit board panel such that a light beam output from the light source impinges one or more sample points on the first side of the substrate, further wherein the sensor is configured to receive a reflected light corresponding to the light beam;

c. a movement and alignment apparatus coupled to the printed circuit board panel and the light emitter and detector device, wherein the movement and alignment apparatus is configured to provide relative movement between the light emitter and detector device and the printed circuit board panel and to scan the light beam over at least a portion of the first side of the printed circuit board panel; and d. a controller configured to receive data from the sensor corresponding to the received reflected light and to determine a distance measurement corresponding to each sample point, and to determine a relative thickness of the printed circuit board panel and a height of the surface feature.

2. The measurement system of claim 1 wherein each sample point corresponds to a pixel of the light beam impinging the first side of the printed circuit board panel.

3. The measurement system of claim 2 wherein the light emitter and detector device is configured to emit the light beam focused as a point, wherein the light beam point impinges the first side of the printed circuit board panel as a single pixel.

4. The measurement system of claim 2 wherein the light emitter and detector device is configured to emit the light beam focused as a line, wherein the light beam line impinges the first side of the printed circuit board panel as a linear series of pixels.

5. The measurement system of claim 2 wherein the light emitter and detector device is configured to emit the light beam focused to impinge the first side of the printed circuit board panel as a two dimensional array of pixels.

6. The measurement system of claim 2 wherein the sensor is configured to sense pixel data according to each sample point.

7. The measurement system of claim 6 wherein light emitter and detector device is configured to determine the distance measurement corresponding for each pixel of the light beam impinging the printed circuit board panel.

8. The measurement system of claim 1 wherein the second side of the printed circuit board panel comprises a second insulating layer, and the light emitter and detector device is a first light emitter and detector device having a first light source and a first sensor, and the measurement system further comprises a second light emitter and detector device having a second light source and a second sensor, wherein the second light emitter and detector device is positioned relative to the printed circuit board panel such that a second light beam output from the second light source impinges one or more sample points on the second side of the substrate, further wherein the second sensor is configured to receive a second reflected light corresponding to the second light beam, further wherein the movement and alignment apparatus is coupled to the second light emitter and detector device, wherein the movement and alignment apparatus is further configured to provide relative movement between the second light emitter and detector device and the printed circuit board panel and to scan the second light beam over at least a portion of the second side of the printed circuit board panel, wherein the controller is further configured to receive data from the second sensor corresponding to the received second reflected light and to determine a distance measurement corresponding to each sample point on the second side, and to determine a relative thickness of the printed circuit board panel.

9. The measurement system of claim 8 wherein the movement and alignment apparatus is configured to move and align the first light emitter and detector device independently of the second light emitter and detector device.

10. The measurement system of claim 8 wherein the movement and alignment apparatus is configured to coordinate movement and alignment of the first light emitter and detector device and the second light emitter and detector device, such that the first light emitter and detector device and the second light emitter and detector device simultaneously scan aligned sample points on the first side and the second side of the printed circuit board assembly.

11. The measurement system of claim 10 wherein the controller is configured to determine a thickness of the printed circuit board panel at a specific sample point aligned on both the first side and the second side when the specific sample point is aligned with insulating layer on both the first light emitter and detector device and the second light emitter and detector device using the determined distance measurement from the first light emitter and detector device at the specific sample point and the determined distance measurement from the second light emitter and detector device at the specific sample point.

12. The measurement system of claim 11 wherein the controller is further configured to determine a height of the first surface feature at another specific sample point aligned on both the first side and the second side when the other specific sample point is aligned with the first surface feature on the first light emitter and detector device and with the insulating layer on the second light emitter and detector device using the determined distance measurement from the first light emitter and detector device at the other specific sample point and the determined distance measurement from the second light emitter and detector device at the other specific sample point.

13. The measurement system of claim 1 wherein the conductive patterned interconnect is a metal trace or a bond pad.

14. A measurement system comprising:

a. a printed circuit board panel comprising a substrate having a first side and a second side opposing the first side, wherein the first side comprises an insulating layer with an electrically conductive surface feature positioned on the insulating layer;

b. a light emitter and detector device comprising a light source and a sensor, wherein the light emitter and detector device is positioned relative to the printed circuit board panel such that a light beam output from the light source impinges one or more sample points on the first side of the substrate, further wherein the sensor is configured to receive a reflected light corresponding to the light beam, wherein each sample point corresponds to a pixel of the light beam impinging the first side of the printed circuit board panel, further wherein the sensor is configured to sense a light intensity value for each pixel, and the light emitter and detector device is configured to determine a light intensity measurement for each pixel;

c. a movement and alignment apparatus coupled to the printed circuit board panel and the light emitter and detector device, wherein the movement and alignment apparatus is configured to provide relative movement between the light emitter and detector device and the printed circuit board panel and to scan the light beam over at least a portion of the first side of the printed circuit board panel; and d. a controller configured to receive data from the sensor corresponding to the received reflected light and the light intensity measurement for each pixel, to determine a distance measurement corresponding to each sample point and to determine a relative thickness of the printed circuit board panel and a height of the surface feature, wherein the controller is further configured to determine if the sample point corresponding to each pixel is a point on the first side of the printed circuit board panel that corresponds to the insulating layer or to the surface feature by comparing the light intensity measurement to light intensity measurements of known material types to determine a material type corresponding to the pixel, and to compare the determined material type corresponding to the pixel to known materials for the insulating layer and the surface feature.

15. The measurement system of claim 14 wherein the controller is further configured to determine a transition point along the first side from insulating layer to surface feature and from surface feature to insulating layer by comparing the determined material type for adjacent pixels, and to determine a number of pixels that separate subsequent transition points along a measured line of sample points, wherein the determined number of pixels that separate subsequent transition points corresponds to a surface feature dimension.

16. The measurement system of claim 15 wherein the controller is further configured to determine a transition point along the first side from insulating layer to surface feature and from surface feature to insulating layer by comparing the determined distance measurements for adjacent pixels, and to verify an accuracy of the determined transition point by comparing the transition points determined using the determined distance measurements and determined using the determined light intensity measurements.

17. A measurement system comprising:

a. a printed circuit board panel comprising a substrate having a first side and a second side opposing the first side, wherein the first side comprises an insulating layer with an electrically conductive surface feature positioned on the insulating layer;

b. a light emitter and detector device comprising a light source and a sensor, wherein the light emitter and detector device is positioned relative to the printed circuit board panel such that a light beam output from the light source impinges one or more sample points on the first side of the substrate, further wherein the sensor is configured to receive a reflected light corresponding to the light beam, wherein each sample point corresponds to a pixel of the light beam impinging the first side of the printed circuit board panel;

c. a movement and alignment apparatus coupled to the printed circuit board panel and the light emitter and detector device, wherein the movement and alignment apparatus is configured to provide relative movement between the light emitter and detector device and the printed circuit board panel and to scan the light beam over at least a portion of the first side of the printed circuit board panel; and d. a controller configured to receive data from the sensor corresponding to the received reflected light and to determine a distance measurement corresponding to each sample point, and to determine a relative thickness of the printed circuit board panel and a height of the surface feature, wherein the controller is further configured to determine a transition point along the first side from insulating layer to surface feature and from surface feature to insulating layer by comparing the determined distance measurements for adjacent pixels, and to determine a number of pixels that separate subsequent transition points along a measured line of sample points, wherein the determined number of pixels that separate subsequent transition points corresponds to a surface feature dimension.

18. The measurement system of claim 1 wherein the controller is further configured to determine a length and width of the surface feature according to the data received from the sensor.

* * * * *